(12) United States Patent
Ouyang et al.

(10) Patent No.: US 11,333,704 B2
(45) Date of Patent: May 17, 2022

(54) SLIDING TEST DEVICE FOR ELECTRONIC COMPONENTS

(71) Applicant: Chroma Ate Inc., Taoyuan (TW)

(72) Inventors: Chin-Yi Ouyang, Taoyuan (TW); Chien-Ming Chen, Taoyuan (TW); Meng-Kung Lu, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 65 days.

(21) Appl. No.: 16/559,701

(22) Filed: Sep. 4, 2019

(65) Prior Publication Data
US 2020/0081060 A1    Mar. 12, 2020

(30) Foreign Application Priority Data
Sep. 6, 2018 (TW) .................................. 107131251

(51) Int. Cl.
*G01R 31/28* (2006.01)
*G01R 1/04* (2006.01)

(52) U.S. Cl.
CPC .......... *G01R 31/2887* (2013.01); *G01R 1/04* (2013.01); *G01R 31/2891* (2013.01); *H01R 2201/20* (2013.01)

(58) Field of Classification Search
CPC ............ G01R 31/2887; G01R 31/2808; G01R 31/2891; G01R 1/04; H01R 2201/20
See application file for complete search history.

(56) References Cited

U.S. PATENT DOCUMENTS

| | | | | |
|---|---|---|---|---|
| 4,471,298 A | * | 9/1984 | Frohlich | G01R 31/2805 324/72.5 |
| 4,818,933 A | * | 4/1989 | Kerschner | G01R 1/04 324/750.16 |
| 5,003,254 A | * | 3/1991 | Hunt | G01R 1/04 269/903 |
| 5,444,388 A | * | 8/1995 | Ideta | G01R 1/04 29/825 |
| 6,191,572 B1 | * | 2/2001 | Fowler | G01R 31/2887 324/754.13 |
| 6,445,977 B1 | * | 9/2002 | Hwang | G01R 31/2808 198/345.1 |
| 6,448,524 B1 | * | 9/2002 | McKenney | G01R 31/2806 209/571 |
| 6,507,185 B1 | * | 1/2003 | Hennekes | G01R 31/2851 324/750.25 |

(Continued)

*Primary Examiner* — Patrick Assouad
*Assistant Examiner* — Demetrius R Pretlow
(74) *Attorney, Agent, or Firm* — McClure, Qualey & Rodack, LLP

(57) ABSTRACT

The invention relates to a sliding test device for electronic components, which mainly comprises a base, a sliding frame and a pressing member, wherein an electronic component to be tested is placed in a chip receiving module of the base, and the sliding frame is slidably moved with respect to the base under sliding engagement between a first sliding guide and a second sliding guide so that a pressing block of the pressing member is aligned with the electronic component presses the electronic component. According to the present invention, the pressing member presses the electronic component and exerts a sufficient contact force on the electronic component, and a reaction force caused by the contact force and the elastic restoring force of probes is internally balanced in the device.

8 Claims, 6 Drawing Sheets

(56) References Cited

U.S. PATENT DOCUMENTS

| | | | | |
|---|---|---|---|---|
| 6,710,798 B1* | 3/2004 | Hershel | G01R 31/2887 |
| | | | 324/750.23 |
| 7,368,929 B2* | 5/2008 | Nayak | G01R 31/2891 |
| | | | 324/750.24 |
| 9,519,024 B2* | 12/2016 | Chen | G01R 1/0433 |
| 2001/0050572 A1* | 12/2001 | Nishikawa | G01R 31/2887 |
| | | | 324/750.18 |
| 2002/0130654 A1* | 9/2002 | Tauchi | G01R 31/2887 |
| | | | 324/750.16 |
| 2004/0100297 A1* | 5/2004 | Tanioka | G01R 31/2887 |
| | | | 324/750.1 |
| 2004/0164723 A1* | 8/2004 | Bae | G01R 31/2893 |
| | | | 324/756.02 |
| 2004/0227534 A1* | 11/2004 | Mueller | G01R 31/2887 |
| | | | 324/750.22 |
| 2005/0127898 A1* | 6/2005 | Yoshioka | G01R 31/2887 |
| | | | 324/750.22 |
| 2005/0194985 A1* | 9/2005 | Heigl | G01R 31/2891 |
| | | | 324/750.22 |
| 2006/0220667 A1* | 10/2006 | Tashiro | G01R 31/2887 |
| | | | 324/750.25 |
| 2008/0095211 A1* | 4/2008 | You | G01R 31/2868 |
| | | | 374/45 |
| 2010/0148814 A1* | 6/2010 | Yalei | G01R 31/2891 |
| | | | 324/750.22 |
| 2011/0057674 A1* | 3/2011 | Weissacher | G01R 31/2891 |
| | | | 324/750.16 |
| 2012/0119773 A1* | 5/2012 | Yu | G01R 31/2808 |
| | | | 324/756.03 |
| 2012/0146675 A1* | 6/2012 | Lai | G01R 31/2808 |
| | | | 324/750.16 |
| 2013/0293252 A1* | 11/2013 | Chen | G01R 31/2896 |
| | | | 324/750.16 |
| 2013/0293254 A1* | 11/2013 | Chen | G01R 31/2887 |
| | | | 324/756.02 |
| 2014/0160270 A1* | 6/2014 | Naito | H01L 21/681 |
| | | | 348/87 |
| 2015/0204907 A1* | 7/2015 | Ku | G01R 1/04 |
| | | | 324/756.04 |
| 2015/0204908 A1* | 7/2015 | Ku | G01R 1/04 |
| | | | 324/756.04 |
| 2015/0226794 A1* | 8/2015 | Chen | G01R 31/2887 |
| | | | 324/756.02 |
| 2016/0116503 A1* | 4/2016 | Kiyokawa | G01R 31/2887 |
| | | | 324/750.24 |
| 2016/0133171 A1* | 5/2016 | Li | G01R 31/2891 |
| | | | 324/750.25 |
| 2018/0217200 A1* | 8/2018 | Dehmel | G01R 1/07378 |
| 2018/0267097 A1* | 9/2018 | Matsumoto | G01R 31/26 |
| 2019/0353701 A1* | 11/2019 | Hamada | G01R 31/2887 |

* cited by examiner

SLIDING TEST DEVICE FOR ELECTRONIC COMPONENTS

BACKGROUND OF THE INVENTION

Field of the Invention

The present invention relates to a sliding test device for electronic components and particularly suitable for testing an electronic component by pressing the electronic component onto a test jig.

DESCRIPTION OF THE RELATED ART

Generally, in order to test an electronic component, the electronic component to be tested must be placed in a test socket, and then a test arm (a pressing member) is provided to exert a force onto the electronic component and press the electronic component downwardly. This ensures that contacts on a lower surface of the electronic component are entirely and electrically contacted with probes in the test socket and the test accuracy is prevented from being affected by contact failure. However, a test arm of an existing testing apparatus such as a test arm TR shown in FIG. 8 (reproduced from FIG. 1A of Taiwanese Patent No. 1452310 entitled "TESTING DEVICE FOR STACKED CHIPS"), is bulky, especially in the vertical direction and thus is disadvantageous for the space arrangement of a test area.

On the other hand, as semiconductor technology continues evolving, the functionality and operation ability of a single chip become more powerful. As a result, a chip has a great number of contacts or pins. In the state of the art, some chips each have a planar size of 70 mm×70 mm and 4500 or more contacts.

In order to verify the quality of the chip, pogo pins are usually used to contact the contacts on the chip. Each pogo pin has a spring force of about 25 to 35 gf, and hence 4,500 pogo pins produce a spring force of 115 kgf. Therefore, the testing apparatus itself must be capable of exerting a pressing force sufficient to overcome the spring force of the pogo pins in order to ensure that the contacts on the chips are entirely and electrically contacted with the pogo pins.

In the case of exerting a great pressing force, a great reaction force would be generated, correspondingly. Due to the action of the exerted force and the reaction force, the testing apparatus must be properly configured. For example, Taiwanese Patent No. 1579568, entitled "ELECTRONIC DEVICE TESTING APPARATUS WITH FASTENING MECHANISM FOR PRESSING HEADER AND SOCKET PLATE", discloses that a pressing head is securely engaged with a socket plate by means of a fastening mechanism, and a reaction force from a chip socket can be dispersed to the fastening mechanism so that stress concentration is reduced and the stability and service life of the apparatus are improved. However, the above-mentioned conventional testing apparatus has a complicated structure and a considerable volume occupied.

As such, there is a demand for an electronic component testing device capable of reducing the occupied volume, providing a pressing force sufficient to ensure contact between a chip and probes and withstanding a corresponding reaction force.

SUMMARY OF THE INVENTION

The main object of the present invention is to provide a sliding test device for electronic components, which is not only capable of effectively reducing the volume occupied by the device and thus allowing more test device to be arranged in the test area, but also capable of providing a pressing force sufficient to ensure contact between test probes and contacts of a chip and withstanding a reaction force for internal force balance so as to improve the stability and service life of the device.

In order to achieve the above object, a sliding test device for electronic components of the present invention mainly comprises a base, a sliding frame and a pressing member, wherein the base has a first sliding guide and a chip receiving module; the sliding frame has a second sliding guide, which is slidably engaged with the first sliding guide of the base; the pressing member is disposed on the sliding frame and comprises a pressing block, wherein an electronic component to be tested is placed in the chip receiving module, and the sliding frame is slidably moved with respect to the base under sliding engagement between the first sliding guide and the second sliding guide so that the pressing block of the pressing member is aligned with the electronic component and presses the electronic component.

According to the present invention, the pressing member is disposed on the sliding frame. By means of the pressing member, the electronic component is pressed so that a contact force sufficient to ensure contact between the chip and probes is generated. Furthermore, by means of the sliding guides, the base and the sliding frame are slidable horizontally or at an arbitrary angle, especially during a transition period between a chip loading phase and a test phrase and a transition period between the test phase and a chip unloading phase. The overall size of the device can be greatly reduced, and the mechanisms of the device can be simplified. The reaction force which is caused by the pressing force generated by the pressing member and the elastic restoring force of the probes can be internally balanced in the device of the present invention, thereby improving reliability and service life.

Preferably, the present invention further comprises a pressing force generating member. The pressing member further comprise a vertical linear actuator. The pressing force generating member is disposed between the vertical linear actuator and the pressing block. In another embodiment of the present invention, the vertical linear actuator of the pressing member can be also used to provide a downward pressing stroke, and the pressing force generating member is used to generate the pressing force to overcome the spring force of the pogo pins. In other words, the downward pressing stroke and the pressing force could be provided solely by the pressing member or by both of the pressing member and the pressing force generating member according to the actual requirements, such as the distance of the stroke, the magnitude of the pressing force.

The device according to the present invention may further comprise a fixing frame and a force spreading plate. One side of the fixing frame is connected to the vertical linear actuator, and the pressing force generating member is disposed on the other side of the fixing frame. The force spreading plate is disposed between the pressing force generating member and the pressing block. In other words, the fixing frame is used to connect the vertical linear actuator and the pressing force generating member, and the force spreading plate can be used to not only connect the pressing force generating member and the pressing block but also uniformly disperse the pressing force generated by the pressing force generating member.

The device of the present invention may further comprise an actuating module, which is disposed on at least one of the base and the sliding frame. The sliding frame is driven and slidably moved with respect to the base by the actuating module. Accordingly, relative sliding movement between the base and the sliding frame is made possible by the actuating module, and thus the automated testing can be realized. According to the present invention, the first sliding guide is a guide rail, and the second sliding guide is a guide groove. However, the sliding guides of the present invention are not limited thereto, and for example, a combination of a wheel and a rail groove or other equivalent sliding guides can be applied to the present invention.

Also, the actuating module of the present invention can include a pneumatic cylinder having a stationary end coupled to the base and a movable end coupled to the sliding frame. The sliding frame can be driven and moved by the pneumatic cylinder with respect to the base. The pneumatic cylinder can be disposed on one side of the base, and the other side of the base can be additionally provided with a stopper for blocking the sliding frame and for aligning the pressing block of the pressing member with the electronic component.

The actuating module of the present invention may include at least one electric motor, at least one gear and at least one rack. The at least one rack is provided on the base, the at least one electric motor is disposed on the sliding frame, and the at least one gear is coupled to the at least one motor and engaged with the at least one rack. The at least one gear is driven and rotated by the at least one electric motor so that the sliding frame is slidably moved with respect to the base under sliding engagement between the first sliding guide and the second sliding guide. Accordingly, relative sliding movement between the base and the sliding frame is made possible by the transmission mechanism formed of the gear and the rack.

The actuating module of the present invention may include at least one driving pulley, at least one driven pulley and at least one driving belt. The at least one driving pulley and the at least one driven pulley are provided on two opposite sides of the base, respectively. The at least one driving belt is looped over the at least one driving pulley and the at least one driven pulley. The sliding frame is connected to the at least one driving belt. Rotation of the at least one driving pulley causes the at least one driving belt to move so that the sliding frame is slidably moved with respect to the base under sliding engagement between the first sliding guide and the second sliding guide. Accordingly, relative sliding movement between the base and the sliding frame is made possible by the transmission mechanism formed of the pulleys and the belt.

The actuating module of the present invention may include a driving cam, a driving rod and a compression spring. The driving cam is pivotally mounted on the base, a guide block is fixed on the base, the guide block has a through hole, and the driving rod extends through the through hole of the guide block. The driving rod includes a first end, a second end and a spring stop. The first end of the driving rod is connected to the sliding frame, and the second end of the driving rod is abutted against the driving cam. The compression spring is fitted over the driving rod between the spring stop and the guide block. Rotation of the driving cam causes the driving rod to move in an axial direction so that the sliding frame is slidably moved with respect to the base under sliding engagement between the first sliding guide and the second sliding guide. Accordingly, relative sliding movement between the base and the sliding frame is made possible by the transmission mechanism formed of the cam and the driving rod.

The actuating module of the present invention may include a crank and a link. The crank is pivotally mounted on the base. One end of the link is hinged to the crank, and the other end of the link is hinged to the sliding frame. Rotation of the crank causes the link to swing so that the sliding frame is slidably moved with respect to the base under sliding engagement between the first sliding guide and the second sliding guide. Accordingly, relative sliding movement between the base and the sliding frame is made possible by the transmission mechanism of the crank and the link.

DESCRIPTION OF THE PREFERRED EMBODIMENTS

Figure 1:
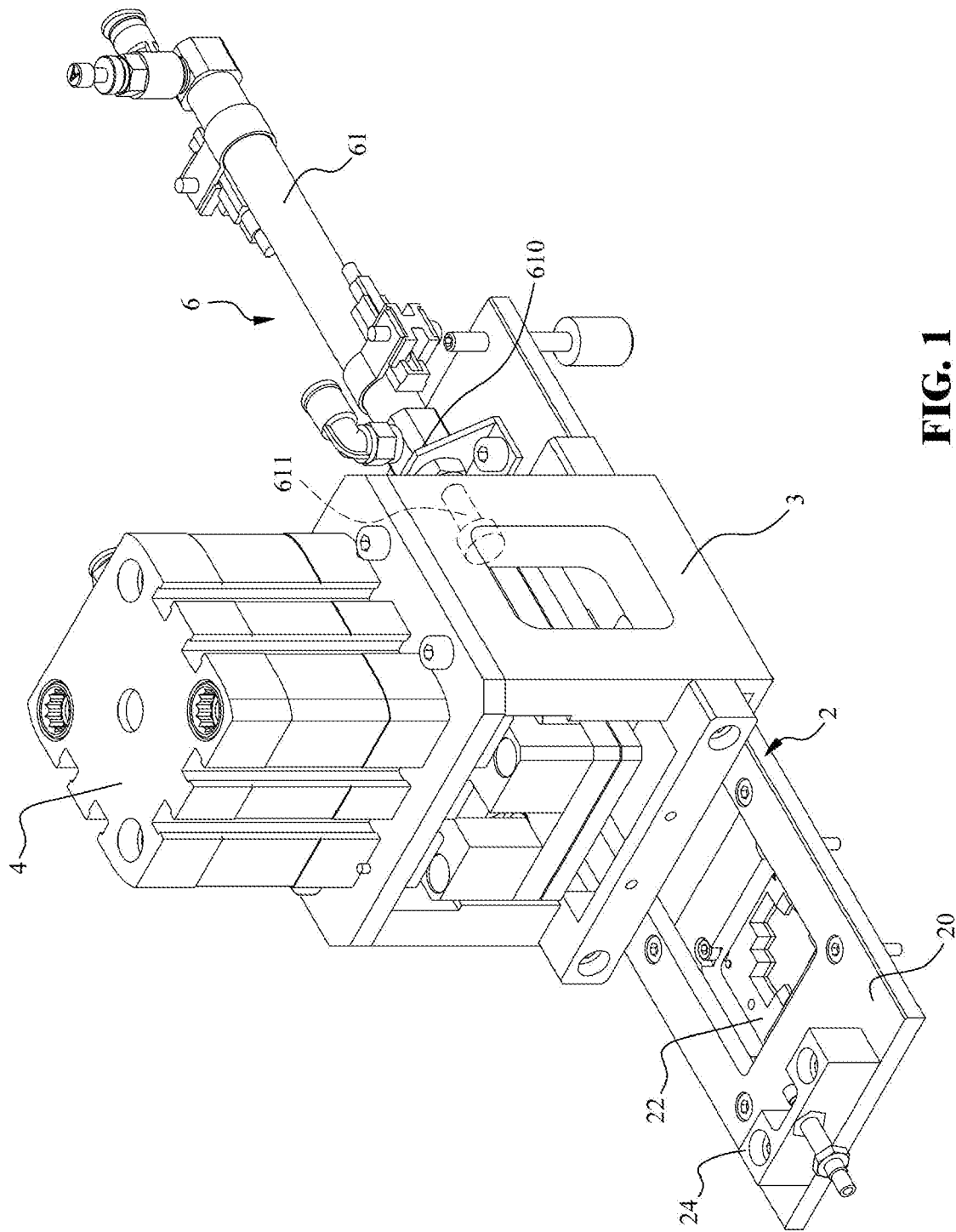
FIG. 1 is a perspective view of a first embodiment of the present invention.

In describing preferred embodiments of a sliding test device for electronic components of the present invention in detail, it is noted that similar elements are designated by the same reference numerals. The drawings of the present invention are merely illustrative and are not necessarily drawn to scale, and all details are not necessarily shown in the drawings.

Figure 2:
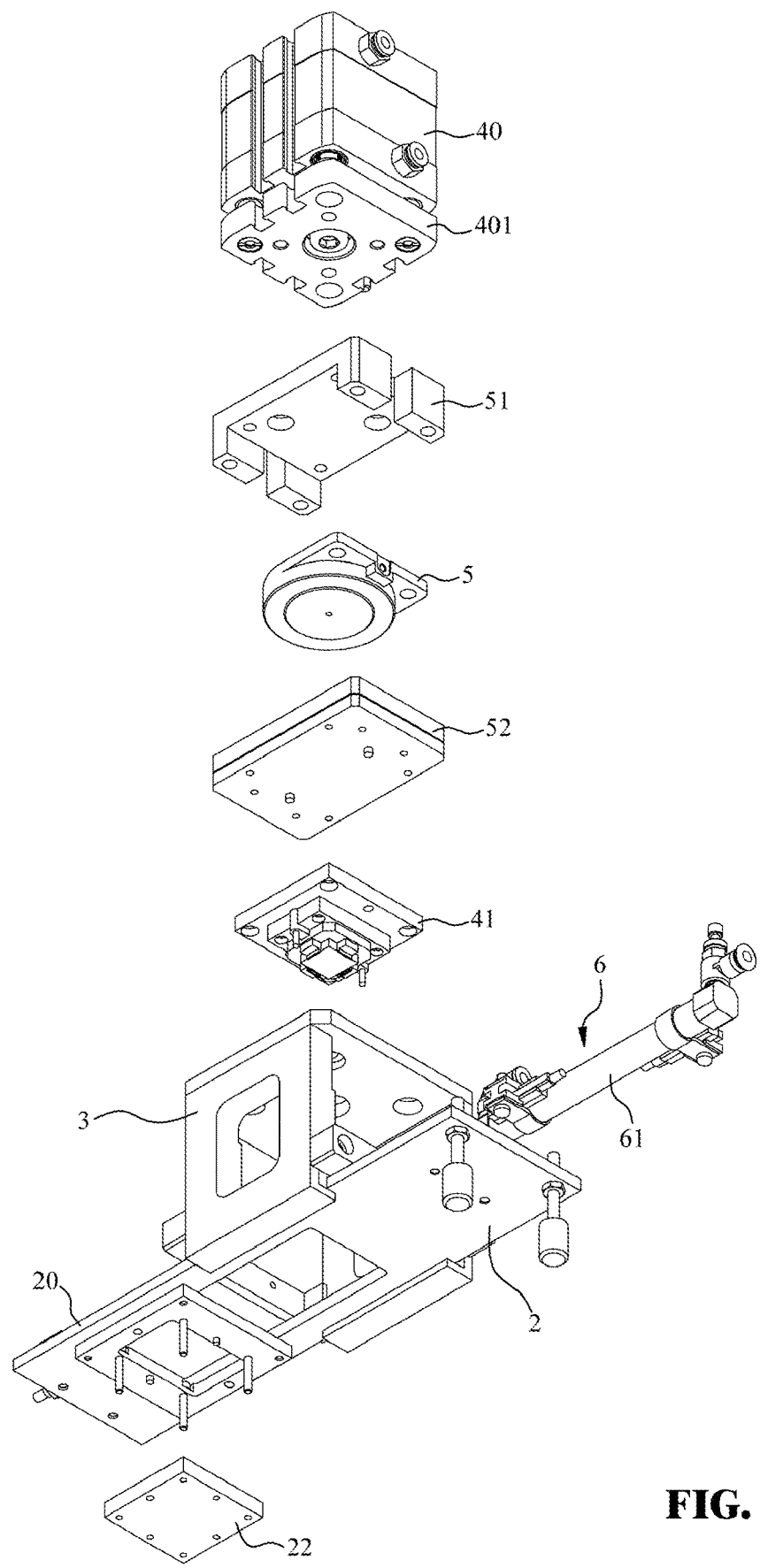
FIG. 2 is an exploded view of the first embodiment of the present invention.
Figure 3:
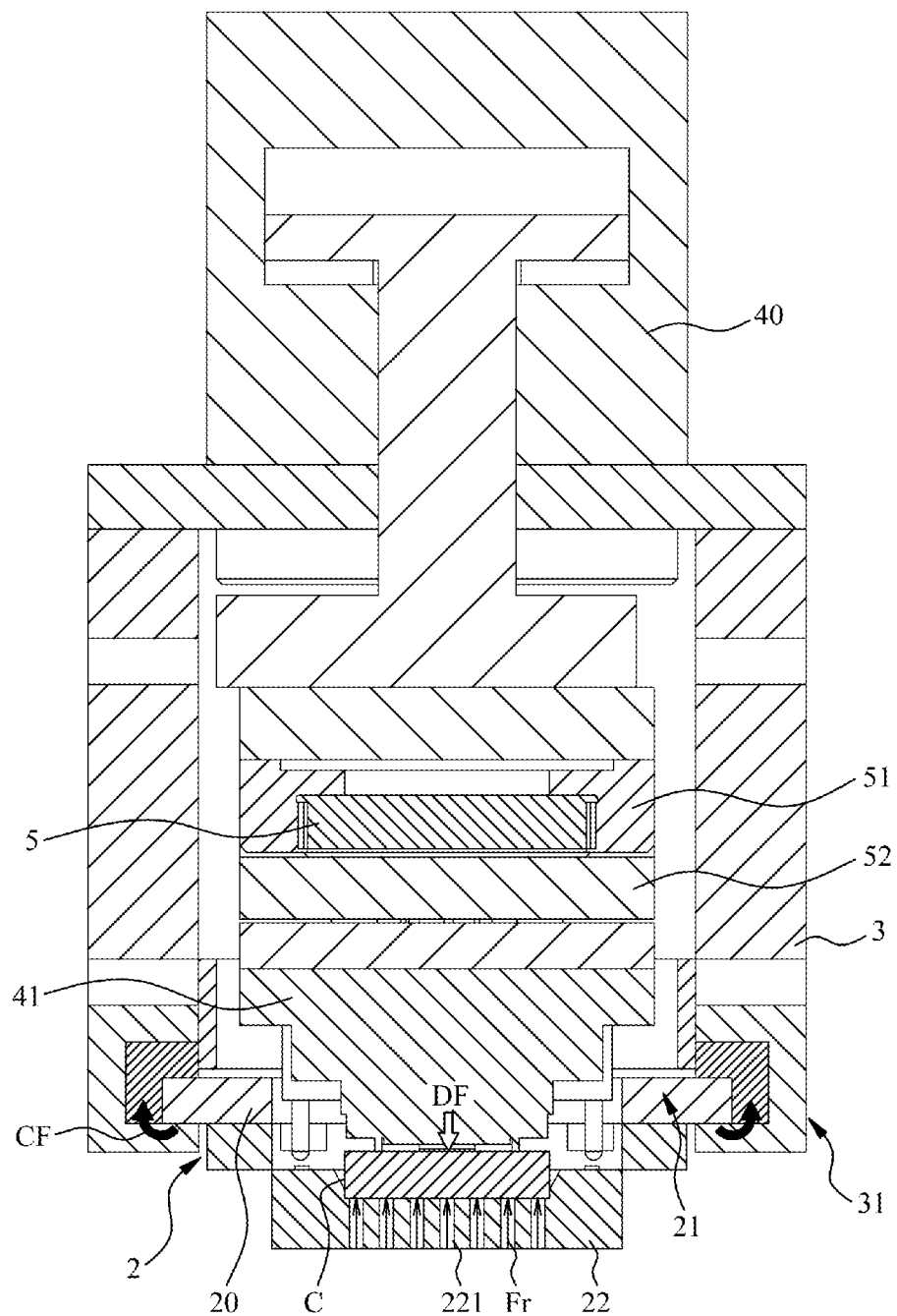
FIG. 3 is a cross-sectional view of the first embodiment of the present invention.

In describing the first embodiment of the present invention, reference is made to FIG. 1, FIG. 2 and FIG. 3, wherein FIG. 1 is a perspective view of a first embodiment of the present invention, FIG. 2 is an exploded view of the first embodiment of the present invention, and FIG. 3 is a cross-sectional view of the first embodiment of the present invention. As shown in the figures, the sliding test device of the first embodiment of the present invention mainly comprises a base 2, a sliding frame 3, a pressing member 4, a pressing force generating member 5 and an actuating module 6. The base 2 includes a base plate 20, a first sliding guide 21 and a chip receiving module 22. In the first embodiment, the two lateral edges of the base plate 20 each serve as the first sliding guide 21 which is in form of a guide rail. The chip receiving module 22 is disposed on the lower surface of the base plate 20 and includes a test socket for accommodating an electronic component C to be tested.

The sliding frame 3 of the first embodiment is a rectangular frame, and two lateral edges of the sliding frame 3 to be coupled to the base 2 each are provided with a second sliding guide 31 which is in form of a guide channel. Accordingly, the second sliding guide 31 of the sliding frame 3 in form of the guide groove is slidably engaged with the first sliding guide 21 of the base 2 in form of the guide rail, so that the sliding frame 3 is slidably movable on the base 2.

The pressing member 4 of the first embodiment includes a vertical linear actuator 40 and a pressing block 41. The vertical linear actuator 40 is a double-acting pneumatic cylinder which is disposed above the frame 3, and the piston end 401 of the double-acting pneumatic cylinder is connected to a fixing frame 51 which is U-shaped. The pressing force generating member 5 which is in form a thin diaphragm cylinder is fixed within the fixing frame 51. A force spreading plate 52 is provided beneath the pressing force generating member 5, and the pressing block 41 is provided beneath the force spreading plate 52.

As shown in FIG. 1 and FIG. 2, the actuating module 6 is disposed on one side of the base plate 20. In the first embodiment, the actuating module 6 comprises a pneumatic cylinder 61 which includes a stationary end 610 and a movable end 611. The stationary end 610 is coupled to the base plate 20, and the movable end 611 is coupled to the sliding frame 3. A stopper 24 is disposed on the other side of the base plate 20 for blocking the sliding frame 3 and for aligning the pressing block 41 of the pressing member 4 with the chip receiving module 22.

With reference to FIG. 3 which is a cross-sectional view, the operation mode of the present embodiment will be described in the following description. In order to test an electronic component C, a robot arm (not shown) transfers the electronic component C and places it in the test socket of the chip receiving module 22. Then, the sliding frame 3 is slidably moved by the actuating module 6 with respect to the base 2 under sliding engagement between the first sliding guide 21 and the second sliding guide 31. Specifically, the pneumatic cylinder 61 is actuated, and the sliding frame 3 is biased by the movable end 611 so that the sliding frame 3 is slidably moved under sliding engagement between the guide rail and the guide groove until the sliding frame 3 is abutted against the stopper 24.

As shown in FIG. 3, the pressing block 41 of the pressing member 4 is exactly aligned with the electronic component C, and with actuation of the vertical linear actuator 40 in a descending stroke allows the pressing block 41 to be in contact with the upper surface of the electronic component C. Then, with actuation of the pressing force generating member 5, a downward pressing force DF is exerted by the pressing force generating member 5 on the electronic component C. The downward pressing force DF is set to be greater than the spring force Fr of a plurality of probes 221 for ensuring that the contacts of the electronic component C are entirely and electrically contacted with the plurality of probes 221. The downward pressing force DF is offset by the spring force Fr of the plurality of probes 221 and a reaction force CF. Since the guide groove of the second sliding guide 31 is captively engaged with the lateral edge (the guide rail) of the base plate 20, the reaction force CF is transferred to the sliding frame 3 via the guide rail and the guide groove. Hence, the internal force balance is achieved. At this time, the contacts of the electronic component C are entirely and electrically contacted with the plurality of probes 221, so the tester (not shown) can perform preset test items, such as System Level Test or Final Test, on the electronic component C.

It is particularly noted that two downward pressing members, namely the pressing member 4 and a pressing force generating member 5, are used in the first embodiment. The pressing member 4 mainly functions to provide a descending stroke while the pressing force generating member 5 functions to provide a contact force. However, the present invention is not limited to the embodiment. It is possible to solely use the pressing member 4 according to the actual requirements, such as the length of the stroke and the magnitude of the contact force.

Figure 4:
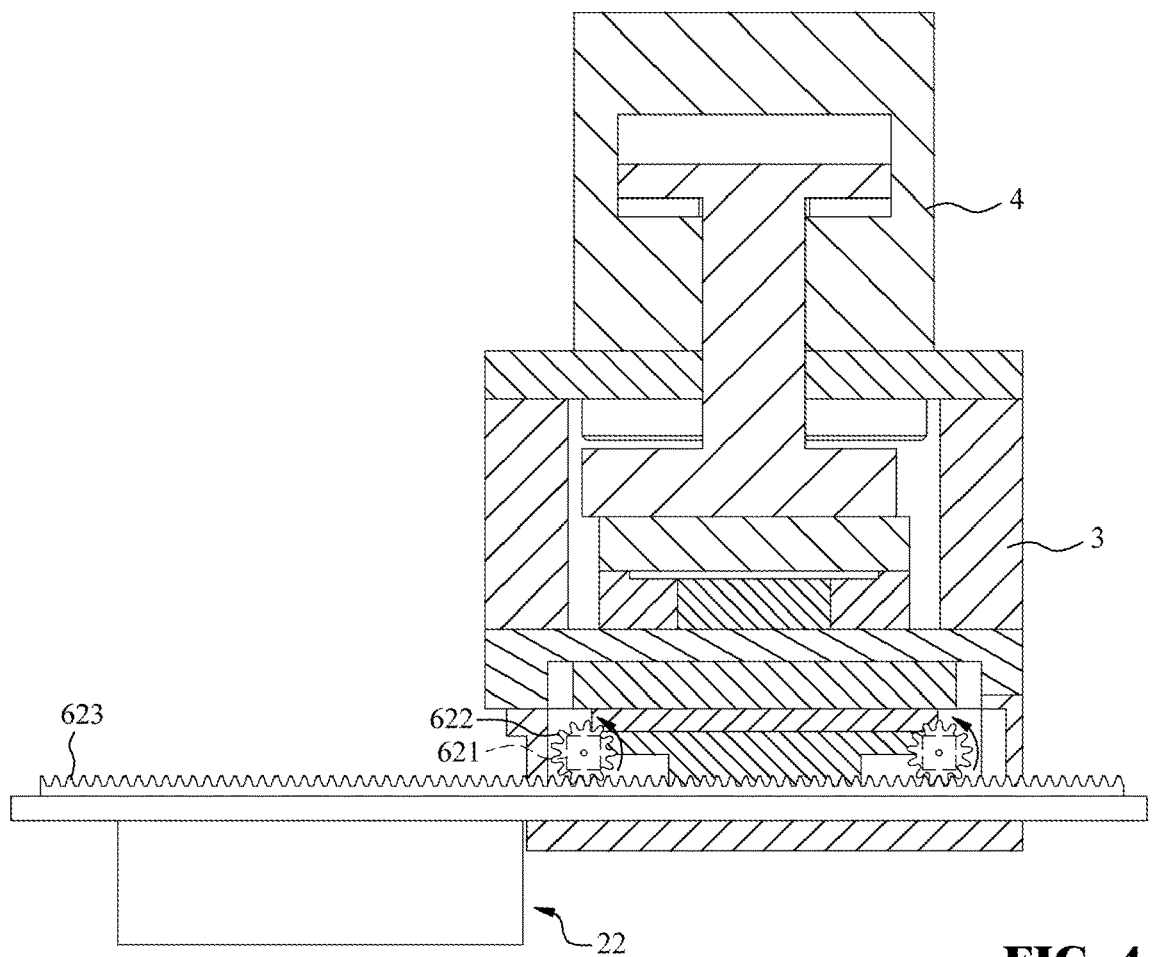
FIG. 4 is a cross-sectional view of a second embodiment of the present invention.

Reference is made to FIG. 4 which is a cross-sectional view showing a second embodiment of the present invention. The second embodiment differs from the first embodiment mainly in the actuating module. In the second embodiment, the actuating module is formed of gears and racks. Specifically, the actuating module of the present embodiment includes a plurality of electric motors 621, a plurality of gears 622 and two racks 623. The electric motors 621 are disposed on the sliding frame 3, and the gears 622 are coupled to the electric motors 621. The two racks 623 are disposed on two opposite lateral edges of the base 2, and the gears 622 are engaged with the racks 623.

Actuation of the electric motors 621 causes rotation of the gears 622 so that the sliding frame 3 is slidably moved with respect to the base 2. In another embodiment of the present invention, the gear 622 may be coupled to the electric motor 621 through a speed reducer. In still another embodiment, the plurality of gears 622 can be driven by a single electric motor 621 if a transmission gear set is arranged to couple the plurality of gears 622. In the second embodiment of the present invention, the electric motors 621 and the gears 622 are disposed on the sliding frame 3, and the racks 623 are disposed on the base 2. However, in another embodiment of the present invention, the racks can be disposed on the sliding frame 3, and the electric motors and the gears are disposed on the base 2.

Figure 5:
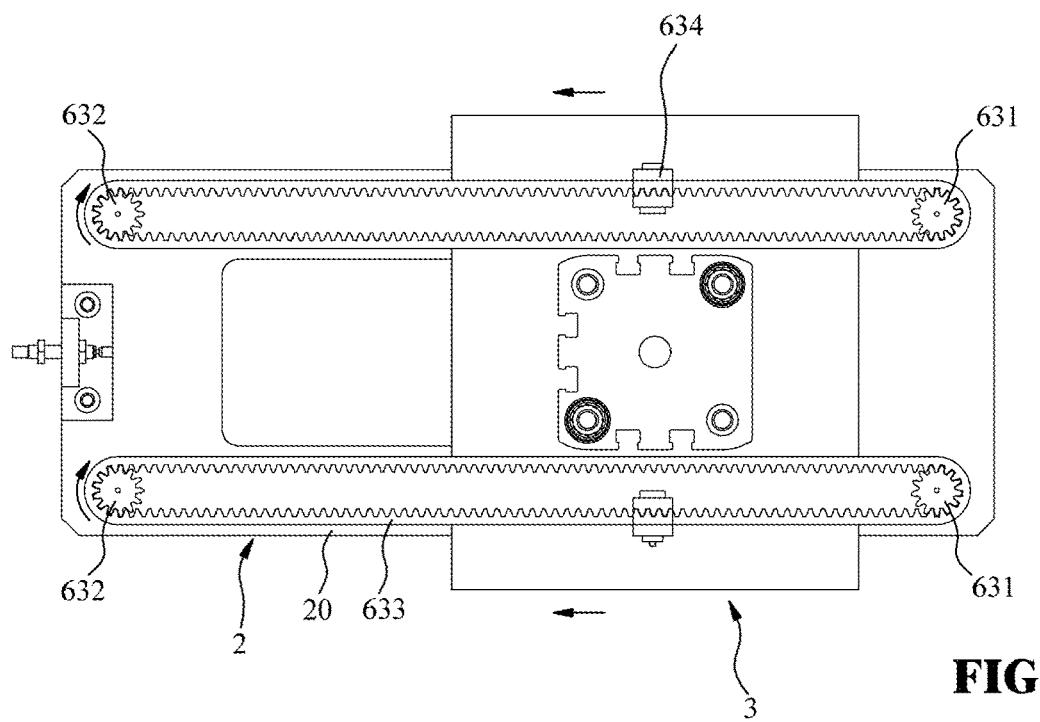
FIG. 5 is a schematic top view of a third embodiment of the present invention.

Reference is made to FIG. 5 which is a schematic top view of a third embodiment of the present invention. The main difference between the third embodiment and the first and second embodiments lies in the actuating module. In the third embodiment, the actuating module is formed of pulleys and belts. Specifically, the actuating module of the third embodiment includes two driving pulleys 631, two driving pulleys 632 and two driving belts 633. At each of two opposite lateral edges of the base plate 20 of the base 2, one driving pulley 631, one driven pulley 632 and one driven belt 633 looped over the one driving pulley 631 and the one driven pulley 632 are arranged on the upper surface of the base plate 20. The sliding frame 3 is connected to the two driving belt 633 via two clamp blocks 634, and the two clamp blocks 634 are arranged at two opposite lateral edges of the sliding frame 3, respectively.

When the driving pulley 631 is driven and rotated by a motor (not shown), the sliding frame 3 is driven by the pulley 631 via the driving belt 633 so that the sliding frame 3 slidably moved with respect to the base 2. In another embodiment of the present invention, the two driving pulleys, the two driven pulleys, and the two driving belts can be disposed on two lateral end faces of the base.

Figure 6:
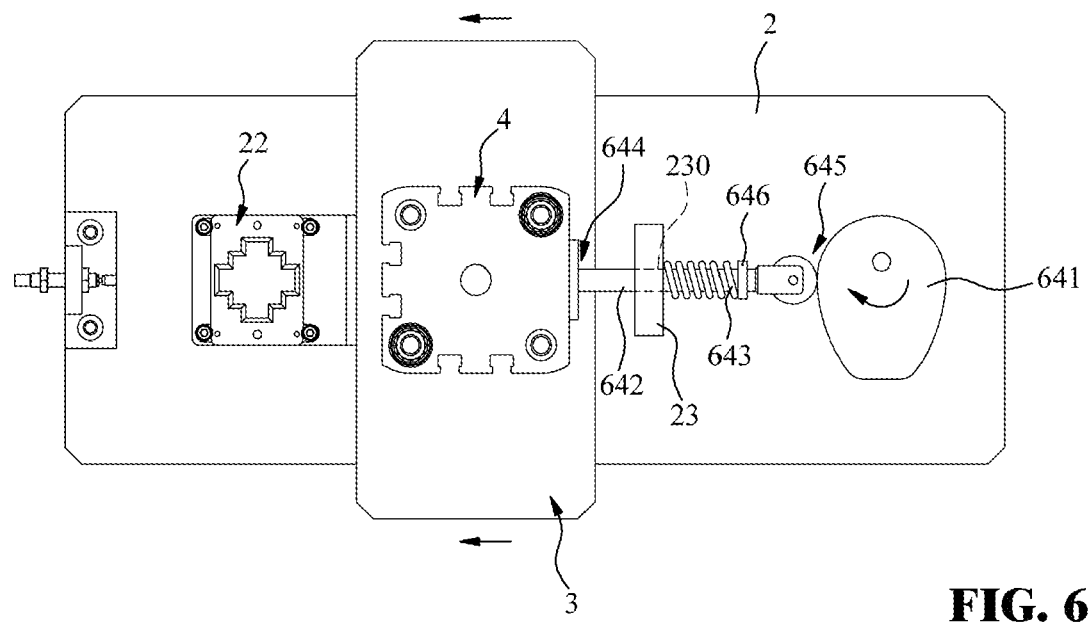
FIG. 6 is a schematic top view of a fourth embodiment of the present invention.

Reference is made to FIG. 6 which is a schematic top view of a fourth embodiment of the present invention. The main difference between the fourth embodiment and the foregoing embodiments lies in the actuating module. In the fourth embodiment, the actuating module is formed of a cam. Specifically, the actuating module of the present embodiment includes a driving cam 641, a driving rod 642 and a compression spring 643, and the driving cam 641 is pivotally mounted on the base 2. A guide block 23 having a through hole 230 is fixed on the base 2, and the driving rod 642 extends through the through hole 230 of the guide block 23. The driving rod 642 includes a first end 644, a second end 645 and a spring stop 646. The first end 644 is connected to the sliding frame 3, and a roller at the second end 645 is abutted against the outer circumferential surface of the driving cam 641. The compression spring 643 is fitted over the driving rod 642 between the spring stop 646 and the guide block 23.

Rotation of the driving cam 641 driven by a motor (not shown) causes the driving rod 642 to move in the axial direction so that the sliding frame 3 is slidably moved with respect to the base 2.

Figure 7:
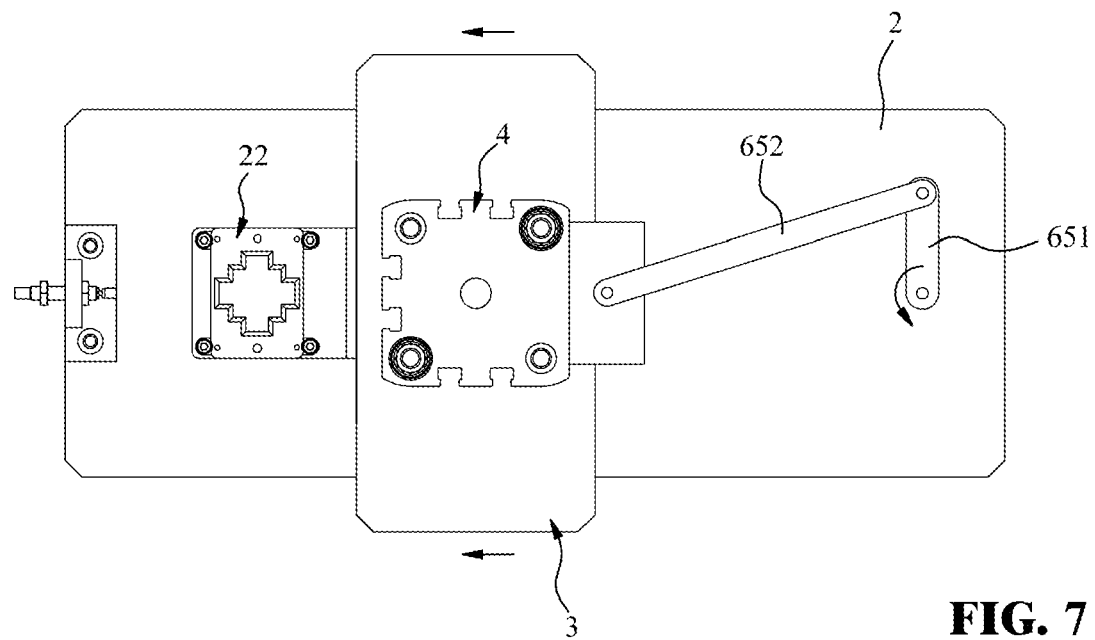
FIG. 7 is a schematic top view of a fifth embodiment of the present invention.
Figure 8:
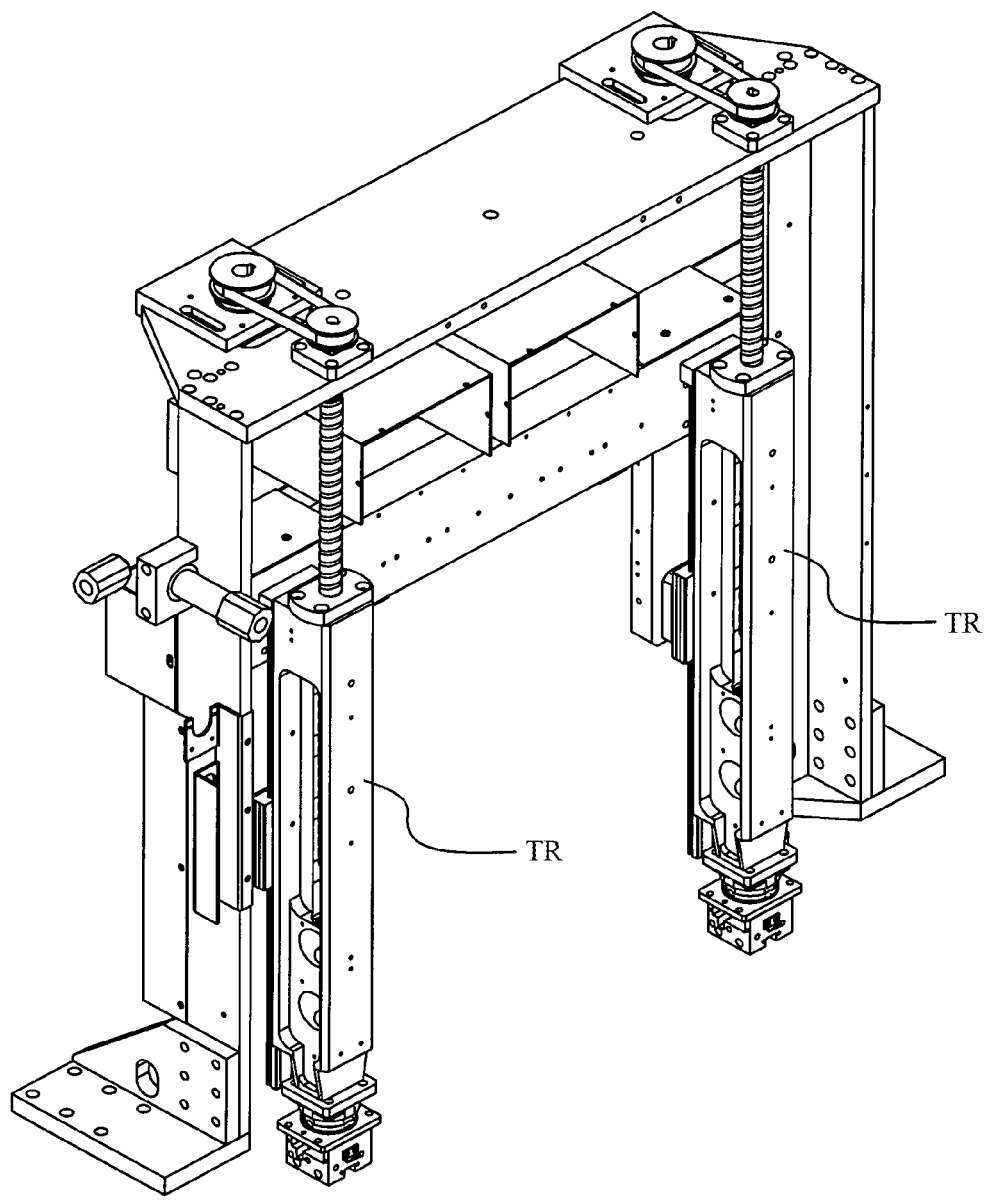
FIG. 8 is a perspective view of a conventional test arm.

Reference is made to FIG. 7 which is a schematic top view of a fifth embodiment of the present invention. The main difference between the fifth embodiment and the foregoing embodiments lies in the actuating module. In the fifth embodiment, the actuating module is formed of a crank. specifically, the actuating module of the present embodiment includes a crank 651 and a link 652. The crank 651 is pivotally mounted on the base 2, one end of the link 652 is hinged to the crank 651, and the other end of the link 652 is hinged to the sliding frame 3. Rotation of the crank 651 driven by a motor (not shown) causes the link 652 to swing so that the sliding frame 3 is slidably moved with respect to the base 2.

Instead of the pneumatic cylinder in the first embodiment, the combination of the gears and the racks in the second embodiment, the combination of the driving pulleys, the driven pulleys and the belts in the third embodiment, the combination of the cam and the driving rod in the fourth embodiment and the combination of the crank and the link in the fifth embodiment, other equivalent slide driving means, such as the combination of a ball screw and a sliding table, a maglev drive or the like, can be applied to the present invention.

It should be understood that the embodiments have been described for illustrative purposes and are not limiting. Accordingly, it is intended that the invention not be limited to the disclosed embodiments, but that it have the full scope permitted by the language of the following claims.

What is claimed is:

1. A sliding test device for electronic components, comprising:
    a base, having a first sliding guide and a chip receiving module;
    a sliding frame, having a second sliding guide slidably engaged with the first sliding guide of the base;
    a pressing member, disposed on the sliding frame, the pressing member comprising a pressing block and a vertical linear actuator; and
    a pressing force generating member disposed between the vertical linear actuator and the pressing block;
    wherein when an electronic component is to be tested, the electronic component is placed in the chip receiving module, and the sliding frame is slidably moved with respect to the base under sliding engagement between the first second sliding guide and the second sliding guide so that the pressing block of the pressing member is aligned with the electronic component; with actuation of the vertical linear actuator in a descending stroke allows the pressing block to be in contact with an upper surface of the electronic component; and a downward pressing force is exerted by the pressing force generating member on the electronic component after the pressing block is in contact with the electronic component;
    wherein, two lateral edges of the base each serve as the first sliding guide which is in form of a guide rail, two lateral edges of the sliding frame to be coupled to the base each are provided with the second sliding guide which is in form of a guide groove, and the guide grooves configured to guide coupling of the guide rails.

2. The sliding test device of claim 1, further comprising a fixing frame and a force spreading plate, wherein one side of the fixing frame is connected to the vertical linear actuator, and the pressing force generating member is disposed on the other side of the fixing frame, and the force spreading plate is disposed between the pressing force generating member and the pressing block.

3. The sliding test device of claim 1, further comprising an actuating module, which is disposed on at least one of the base and the sliding frame, wherein the sliding frame is driven and slidably moved with respect to the base by the actuating module.

4. The sliding test device of claim 3, wherein the actuating module includes a pneumatic cylinder comprising a stationary end coupled to the base and a movable end coupled to the sliding frame.

5. The sliding test device of claim 3, wherein the actuating module includes at least one electric motor, at least one gear and at least one rack, the at least one rack is provided on the base, the at least one electric motor is disposed on the sliding frame, the at least one gear is coupled to the at least one electric motor and engaged with the at least one rack, wherein the at least one gear is driven and rotated by the at least one electric motor so that the sliding frame is slidably moved with respect to the base under sliding engagement between the first sliding guide and the second sliding guide.

6. The sliding test device claim 3, wherein the actuating module includes at least one driving pulley, at least one driven pulley and at least one driving belt, the at least one driving pulley and the at least one driven pulley are provided on two opposite sides of the base, respectively, the at least one driving belt is looped over the at least one driving pulley and the at least one driven pulley, the sliding frame is connected to the at least one driving belt, rotation of the at least one driving pulley causes the at least one driving belt to move so that the sliding frame is slidably moved with respect to the base under sliding engagement between the first sliding guide and the second sliding guide.

7. The sliding test device of claim 3, wherein the actuating module includes a driving cam, a driving rod and a compression spring, the driving cam is pivotally mounted on the base, a guide block is fixed on the base, the guide block has a through hole, the driving rod extends through the through hole of the guide block, wherein the driving rod includes a first end, a second end and a spring stop, the first end is connected to the sliding frame, the second end is abutted against the driving cam, the compression spring is fitted over the driving rod between the spring stop and the guide block, wherein rotation of the driving cam causes the driving rod to move in an axial direction so that the sliding frame is slidably moved with respect to the base under sliding engagement between the first sliding guide and the second sliding guide.

8. The sliding test device of claim 3, wherein the actuating module includes a crank and a link, the crank is pivotally mounted on the base, one end of the link is hinged to the crank, and the other end of the link is hinged to the sliding frame, wherein rotation of the crank causes the link to swing so that the sliding frame is slidably moved with respect to the base under sliding engagement between the first sliding guide and the second sliding guide.

* * * * *